United States Patent
Fujimoto et al.

(10) Patent No.: US 7,524,748 B2
(45) Date of Patent: Apr. 28, 2009

(54) METHOD OF INTERCONNECTING TERMINALS AND METHOD OF MOUNTING SEMICONDUCTOR DEVICES

(75) Inventors: Kozo Fujimoto, 3-3-20, Yahatacho, Nada-ku, Kobe-shi, Hyogo 657-0051 (JP); Kiyokazu Yasuda, Ibaraki (JP); Jong-Min Kim, Toyonaka (JP)

(73) Assignees: Senju Metal Industry Co., Ltd., Tokyo (JP); Kozo Fujimoto, Kobe (JP)

( * ) Notice: Subject to any disclaimer, the term of this patent is extended or adjusted under 35 U.S.C. 154(b) by 0 days.

(21) Appl. No.: 10/544,234

(22) PCT Filed: Feb. 4, 2004

(86) PCT No.: PCT/JP2004/001157

§ 371 (c)(1),
(2), (4) Date: Aug. 18, 2006

(87) PCT Pub. No.: WO2004/070827

PCT Pub. Date: Aug. 19, 2004

(65) Prior Publication Data

US 2007/0001313 A1    Jan. 4, 2007

(30) Foreign Application Priority Data

Feb. 5, 2003    (JP) .............................. 2003-028647

(51) Int. Cl.
*H01L 21/44*    (2006.01)
(52) U.S. Cl. ..................................... 438/597
(58) Field of Classification Search ................. 438/597
See application file for complete search history.

(56) References Cited

U.S. PATENT DOCUMENTS 4,568,592 A * 2/1986 Kawaguchi et al. .......... 428/107

(Continued)

FOREIGN PATENT DOCUMENTS

JP    08186156    7/1996

(Continued)

OTHER PUBLICATIONS

"Study of Evaluation of Adhesive Property in Resin Joint" by Y. Ohta et al., 8th Symposium on Microjoining and Assembly Technology in Electronics, Jan. 31-Feb. 1, 2002, Yokohama, Japan.

(Continued)

*Primary Examiner*—N Drew Richards
*Assistant Examiner*—Ankush K Singal
(74) *Attorney, Agent, or Firm*—Michael Tobias

(57) ABSTRACT

A method of interconnecting terminals so as to obtain an excellent electrical connection between terminals such as opposing electrodes and a mounting method for semiconductor devices using this connecting method are provided. Electrode pads 21 of a semiconductor chip 20 and lands 11 which are provided on a substrate 10 so as to correspond with the electrode pads 21 are placed so as to oppose each other with an electrically conductive adhesive therebetween. Then, the electrically conductive adhesive is heated to a temperature which is higher than the melting point of electrically conductive particles contained in the electrically conductive adhesive and at which a resin is not completely cured, and the electrically conductive particles are bonded to each other. Then, the semiconductor chip 20 and the substrate 10 are secured by completely curing the resin in the electrically conductive adhesive.

14 Claims, 13 Drawing Sheets

U.S. PATENT DOCUMENTS

| | | | | |
|---|---|---|---|---|
| 4,735,847 A | * | 4/1988 | Fujiwara et al. | 428/209 |
| 5,136,365 A | | 8/1992 | Pennisi et al. | 357/72 |
| 5,891,366 A | * | 4/1999 | Gruenwald et al. | 252/514 |
| 6,663,799 B2 | * | 12/2003 | Kokubo et al. | 252/512 |
| 6,690,564 B1 | * | 2/2004 | Haruta et al. | 361/212 |
| 6,909,180 B2 | * | 6/2005 | Ono et al. | 257/734 |

FOREIGN PATENT DOCUMENTS

| | | | |
|---|---|---|---|
| JP | 08315883 | | 11/1996 |
| JP | 10004126 | | 1/1998 |
| JP | 11004064 | | 1/1999 |
| JP | 11186334 | | 7/1999 |
| JP | 2002-026070 | * | 7/2000 |
| JP | 2002-343829 | * | 5/2001 |
| JP | 2002026070 | | 1/2002 |
| JP | 2003-174252 | * | 7/2002 |
| JP | 2002343829 | | 11/2002 |
| WO | WO 0057469 | | 9/2000 |

OTHER PUBLICATIONS

"Recent News Concerning Electronic Mounting Technology", Polyfile, vol. 35, No. 3, pp. 14-18 (1998).

* cited by examiner

US 7,524,748 B2

METHOD OF INTERCONNECTING TERMINALS AND METHOD OF MOUNTING SEMICONDUCTOR DEVICES

TECHNICAL FIELD

This invention relates to a method of interconnecting terminals in order to connect terminals such as electrodes provided on electronic parts such as semiconductor chips or discrete components to external terminals and to a method of mounting semiconductor devices using this connecting method.

BACKGROUND ART

In the field of electronics, in response to demands for higher speeds and larger capacity, smaller size and lighter weight of electronic equipment, the development of mounting technology for realizing a higher degree of integration and higher density of electronic parts such as semiconductor chips and discrete parts is being advanced. One mounting technique for such semiconductor devices which has been proposed is the flip chip mounting method using bare chips.

In the flip chip mounting method, first, a plurality of electrode pads are formed on a bare chip, and bumps made of solder, gold, or the like are formed on the electrode pads. Then, in order to join the bumps of the bare chip and the circuit electrodes of a substrate (referred to below as lands), the surface of the bare chip on which the electrode pads are formed is made to oppose the surface of the substrate on which the lands are formed, and the electrode pads are electrically connected to the corresponding lands. In order to guarantee an electrical connecting strength and mechanical bonding strength between the bare chip and the substrate, after the pads and the lands are joined to each other in the above-described manner, the underfill method, in which a resin is made to flow and the bare chip and the substrate are secured to each other, is sometimes also carried out.

When performing mounting of an electronic part such as an optical device having a low heat resistance temperature, in order to prevent thermal degradation of the electronic part, it is necessary to join the electrode pads (bumps) and the lands at a low temperature. The flip chip mounting method using an electrically conductive adhesive such as an anisotropic conductive film (ACF) or an anisotropic conductive paste (ACP) has been proposed as a technique which can perform such low temperature bonding (see, for example, Patent Documents 1, 2, and the like).

The above-mentioned electrically conductive adhesive is a material for connecting electrodes which can provide electrical conductivity between electrode pads (bumps) and lands (referred to below as opposing electrodes) and provide insulating properties between adjoining electrode pads and adjoining lands (both referred to below as adjoining electrodes) by dispersing electrically conductive particles of a metal or the like in a resin. Namely, electrical conductivity between opposing electrodes is made possible by the electrically conductive particles contained in the electrically conductive adhesive, while insulation between adjoining electrodes is guaranteed, opposing electrodes are adhered to each other, and the bare chip and substrate are secured to each other by the resin contained in the electrically conductive adhesive.

In the above-described electrically conductive adhesive, normally, electrically conductive particles are uniformly dispersed in a resin. The dispersed electrically conductive particles physically contact the electrode pads (bumps) and the lands, as a result of which electrical connection between opposing electrodes is made possible.

However, when using an electrically conductive adhesive having electrically conductive particles uniformly dispersed in a resin in the manner described above, there is the possibility that the electrically conductive particles contained in the electrically conductive adhesive cannot be effectively utilized for providing electrical conductivity between opposing electrodes. Namely, the electrically conductive particles are uniformly dispersed in the resin, and it is thought that the electrically conductive particles which contribute to conductivity between opposing electrodes are a portion of the electrically conductive particles contained in the electrically conductive adhesive (see Non-patent Document 1). Therefore, with an electrically conductive adhesive, there is the possibility that adequate reliability of electrical connections between opposing electrodes cannot be obtained, and in addition, the electrically conductive particles which do not contribute to conductivity between opposing electrodes obstruct electrical insulation between adjoining electrodes. Furthermore, the electrically conductive particles contained in the electrically conductive adhesive cannot be effectively utilized, and it is difficult to realize decreases in cost.

In Patent Document 3, particles which have an aligning effect by electric field, and they are aligned in the direction of an electric field upon the application of an electric field are used as electrically conductive particles. Namely, in Patent Document 3, an electrically conductive bonding agent is supplied between a bare chip and a substrate, and opposing electrodes are electrically connected to each other by applying an electric field to this electrically conductive adhesive and aligning the electrically conductive particles.

Patent Document 1: International Patent Application Publication Number WO 2000/57469 (published on Sep. 28, 2000)

Patent Document 2: Japanese Published Unexamined Patent Application Hei 10-4126 (published on Jan. 6, 1998) (Heisei 10))

Patent Document 3: Japanese Published Unexamined Patent Application Hei 8-315883 (published on Nov. 29, 1996 (Heisei 8))

Non-patent Document 1: "Recent News Concerning Electronic Mounting Technology", Polyfile, Volume 35, No. 3, pages 14-18, (1998)

Non-patent Document 2: Y. Ohta et al., "Research on Evaluating Properties of Joints in Resin Connections", collected papers from the Eighth Symposium on Microjoining and Assembly Technology in Electronics, pages 169-174 (2002)

DISCLOSURE OF THE INVENTION

However, in the above-described conventional electrically conductive adhesives, the electrically conductive particles contained in the electrically conductive adhesive are coated with a resin, so even if the electrically conductive particles physically contact each other due to being aligned, there is the problem that the resin which covers the electrically conductive particles causes conducting defects.

Namely, in the technology described in Patent Document 3, electrically conductive particles dispersed in a resin undergo dielectric polarization by the application of an electric field, and the electrically conductive particles are aligned between opposing electrodes by electrostatic attraction produced by the dielectric polarization. Therefore, there is the possibility of the electrically conductive particles being aligned not so as to directly contact each other but so as to contact through the resin. In such a case, a decrease in conductivity between the electrically conductive particles occurs, and it becomes difficult to obtain adequate reliability of the electrical connection between the opposing electrodes, and this leads to a decrease in the yield of semiconductor devices.

In addition, the electrically conductive particles described in Patent Document 3 are dielectric, and it is said that their electrical resistivity is preferably $10^8$ ohm-cm to $10^{-3}$ ohm-cm (paragraph 0027 and elsewhere). Therefore, conductivity on the same order as that of a metal cannot be expected. In addition, with electronic devices which are extremely weak against static electricity, the application of an electric field from the outside thereof and arraying of the electrically conductive particles creates problems with respect to reliability of the electronic devices.

The present invention was made in order to solve the above-described problems of the prior art, and its object is to provide a method of interconnecting terminals which can guarantee adequate electrical connection between terminals such as opposing electrodes and which can obtain the same level of electrical resistance between terminals as with a metal connection as well as a mounting method for semiconductor devices using this connecting method.

A method of interconnecting terminals according to the present invention is characterized by including a terminal placement step in which terminals are placed opposite each other with an anisotropic electrically conductive resin composition which contains at least electrically conductive particles and a resin component which is not completely cured at the melting point of the electrically conductive particles therebetween, a resin heating step in which the anisotropic electrically conductive resin composition is heated to a temperature which is higher than the melting point of the electrically conductive particles and at which the resin component is not completely cured, and a resin component curing step in which the resin component is cured.

According to the present invention, the anisotropic electrically conductive resin composition is heated to a temperature higher than the melting point of the electrically conductive particles, and at this temperature, the electrically conductive particles in the resin component which is not completely cured are melted. Since the electrically conductive particles can freely move inside the resin component, the molten electrically conductive particles spread on the terminal surface, which is the interface between the terminals and the anisotropic electrically conductive resin, and a "wetted" state takes place. The molten electrically conductive particles collect by agglomeration within the resin component and chemically bond. As a result, the molten electrically conductive particles are aligned so that they are electrically connected to the opposing terminals. Then, by curing the resin component, the opposing terminals are secured by the anisotropic electrically conductive resin in a state in which conduction can take place between the terminals.

In this manner, according to the present invention, the electrically conductive particles are melted and allowed to collect or coalesce by themselves, and chemical bonds such as metallic bonds can be formed between the electrically conductive particles and between the electrically conductive particles and the terminals. Namely, the opposing terminals are in a state in which they are connected by chemical bonding. Thus, the electrical resistance between the terminals can be of the same level as with a metal connection, and the electrical connection between the terminals attains a high reliability.

According to another mode of the present invention, in the above-described method of interconnecting terminals, in the resin heating step, the terminals are positioned against each other through the anisotropic electrically conductive resin composition.

According to this mode, at the temperature at which the electrically conductive particles contained in the anisotropic electrically conductive resin composition melt, both terminals are positioned against each other through the anisotropic electrically conductive resin composition so that one terminal approaches the other terminal, and the distance between the opposing terminals decreases. Therefore, it becomes easier for the electrically conductive particles to "wet" the surface of the terminals, and it becomes easier for the electrically conductive particles to agglomerate. As a result, in the space between the opposing terminals, the molten electrically conductive particles can be bonded to each other with more certainty, and a highly reliable conducting path between the terminals can be obtained.

According to yet another mode of the present invention, the resin component is a resin having reducing properties which can reduce at least one of the surface of the terminals and the surface of the electrically conductive particles.

According to this mode, since the resin component has reducing properties with respect to the surface of the terminals and the surface of the electrically conductive particles, it can activate the surface of the terminals and the surface of the electrically conductive particles. As a result, if an anisotropic electrically conductive resin composition containing the resin component having reducing properties is used, the surface of the terminals or the surface of the electrically conductive particles is reduced and the surface is activated. It becomes easier, therefore, to bond the surface of the terminals to the electrically conductive particles, and it becomes easier to bond the electrically conductive particles to each other. Thus, bonding by the electrically conductive particles between opposing terminals can be performed with greater certainty, and the reliability of the conducting paths formed between terminals can be increased.

According to yet another mode of the present invention, in the terminal placement step, the anisotropic electrically conductive resin composition may be supplied so as to achieve a state in which the anisotropic electrically conductive resin fills the entire space between opposing members on which the terminals are provided including the space between each of the opposing terminals.

According to this mode, after the heating and curing of the anisotropic electrically conductive resin composition which fills the entire space between opposing members having the terminals, the electrically conductive particles agglomerate at the terminal portions, and in locations other than the terminals, only the resin remains. In this manner, the terminals are metallically bonded to each other, and adjoining terminals are insulated from each other by the resin material. Adhesive bonding is achieved to guarantee an adequate bonding strength.

As a result, the process of supplying the anisotropic electrically conductive resin composition becomes easier, the number of process steps is greatly reduced, and metal bonding and resin bonding can be simultaneously achieved. In addition, low temperature working becomes possible when interconnecting terminals.

A method of mounting a semiconductor device according to the present invention is characterized by including an electrode placement step in which electrode pads of a semiconductor chip and circuit electrodes on a circuit substrate which are provided so as to correspond to the electrode pads are placed so as to oppose each other with an anisotropic electrically conductive resin composition containing at least electrically conductive particles and a resin component therebetween, a resin heating step in which the anisotropic electrically conductive resin composition is heated to a temperature which is higher than the melting point of the electrically conductive particles and at which the resin component is not completely cured, and a resin component curing step in which the resin component is cured.

According to this method, when electrode pads of a semiconductor chip and circuit electrodes on a circuit substrate are electrically connected in a semiconductor device, the above-described method of interconnecting terminals can be used. As a result, a mounting method can be provided which can cope with the trend toward finer pitch in recent semiconductor chips and similar devices. Accordingly, the yield of semiconductor devices can be increased.

In this case, by using electrically conductive particles having a relatively low melting point, the heating temperature when mounting a semiconductor chip on a circuit substrate can be set to a low level. As a result, a mounting method for a semiconductor device according to the present invention can suitably be used for mounting electronic parts such as optical elements having low heat resistance.

From another standpoint, a mounting method for a semiconductor device according to the present invention is characterized in that in the electrode placement step, the anisotropic electrically conductive resin composition is supplied so as to achieve a state in which the anisotropic electrically conductive resin composition fills the entire space between the opposing semiconductor chip and the circuit substrate including the space between the opposing electrode pads and circuit electrodes.

According to this method, after heating and cooling of the anisotropic electrically conductive resin composition which fills the entire space between the semiconductor chip and the circuit substrate, the electrically conductive particles agglomerate in the region between the electrode pads and circuit electrodes, and only the resin is present in other regions. As a result, the electrode pads and the circuit electrodes are metallically bonded to each other, adjoining electrode pads and circuit electrodes are insulated from each other by the resin material, and adhesive bonding is achieved to guarantee adequate bonding strength.

As a result, the process of supplying the anisotropic electrically conductive resin composition is simplified, the number of process step is greatly reduced, and metallic bonding and resin bonding are simultaneously achieved. In addition, low temperature working becomes possible when mounting a semiconductor device.

As described above, advantages such as the following are obtained by a method of interconnecting terminals according to the present invention.

(1) The electrically conductive particles melt and agglomerate and are chemically bonded to each other, and the melted electrically conductive particles spread on the surface of the terminals and achieve a "wetted" state. As a result, the terminals are joined to each other by metallic bonding, and the effect is provided that electrical resistance between the terminals can be made to be of the same level as the electrical resistance of metals. Thus, the reliability of electrical connection between opposing terminals can be increased.

(2) In the step of heating the anisotropic electrically conductive resin composition, if the terminals are pressed towards each other with the anisotropic electrically conductive resin composition disposed therebetween and the distance between the terminals is decreased, the molten electrically conductive particles easily agglomerate and bonding becomes easier. The reliability of electrical connection between terminals is further increased.

(3) When the resin component contained in the anisotropic electrically conductive resin composition has a surface activating effect with a reducing action which reduces at least one of the surface of the terminals and the surface of the electrically conductive particles, joining of the surfaces of the terminals and the electrically conductive particles and joining of the electrically conductive particles to each other become easier, and the reliability of the conducting path formed between terminals can be increased.

(4) By supplying the anisotropic electrically conductive resin composition so as to achieve a state such that in the terminal placement step the anisotropic electrically conductive resin composition fills the entire space between opposing members on which the terminals are provided including the space between opposing terminals, the process of supplying the anisotropic electrically conductive resin composition becomes simpler and the man-hours required are greatly reduced, and metallic bonding and resin bonding can be simultaneously achieved. In addition, low temperature working becomes possible when interconnecting terminals.

According to a method of mounting semiconductor devices of the present invention, advantages such as the following are obtained.

(1) In a method of connecting electrode pads on a semiconductor chip and circuit electrodes on a circuit substrate provided in positions corresponding to the electrode pads, it is possible to cope with the tendency towards finer pitch in recent semiconductor chips and similar devices, and the yield of semiconductor devices can be increased. In addition, since treatment at a relatively low temperature is possible, it is suitable for mounting of electronic parts such as optical elements having low heat resistance.

(2) In the electrode placement step, when the anisotropic electrically conductive resin composition is supplied so as to achieve a state in which the anisotropic electrically conductive resin composition fills the entire space between the opposing semiconductor chip and circuit substrate including the space between the opposing electrode pads and circuit electrodes, supply of the anisotropic electrically conductive resin becomes simpler, the man-hours required can be greatly reduced, and metal bonding and resin bonding are simultaneously accomplished. In addition, low temperature working becomes possible when mounting a semiconductor device.

In this manner, according to the present invention, in a resin heating step of heating an anisotropic electrically conductive resin composition, namely a resin composition containing low melting point metal fillers, it becomes possible to make the electrically conductive particles (the low melting point metal filler) contained in the anisotropic electrically conductive composition flow, they are melted and agglomerated, and terminals or electrodes are interconnected by chemical bonding or metal bonding. When the anisotropic electrically conductive resin composition is supplied only between the terminals or electrodes, the electrically conductive particles, i.e., the low melting point metal filler melts and achieves electrical connection by agglomerating between the terminals or electrodes, while the resin is in a liquid state, and then the terminals or electrodes are further interconnected by resin bonding due to subsequent curing of the resin component. When the space between the circuit substrate and the semiconductor chip is completely filled by the anisotropic electrically conductive resin, electrical connection is achieved by the electrically conductive particles (the low melting point metal filler) which melt and agglomerate between the terminals or electrodes, and resin connection between the terminals or electrodes is further achieved by subsequent curing of the resin component.

BRIEF DESCRIPTION OF THE DRAWINGS

FIG. 9(a) shows the connection between electrically conductive particles and between a copper plate and the electrically conductive particles, and FIG. 9(b) shows the connection between the electrically conductive particles.

BEST MODE FOR CARRYING OUT THE INVENTION

An embodiment of the present invention will be explained below based on FIGS. 1-3.

Figure 1:
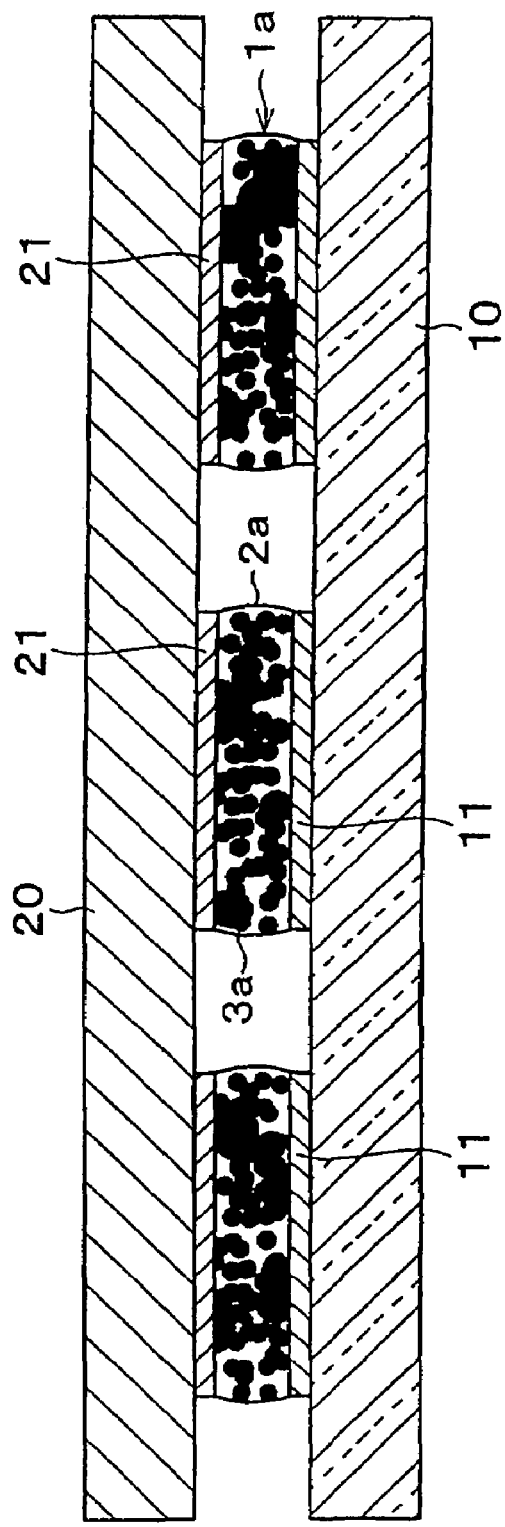
FIG. 1 is a cross-sectional view showing one embodiment of a semiconductor device in which opposing electrodes are joined by a mounting method for a semiconductor device according to the present invention.

As shown in FIG. 1, in this embodiment of a semiconductor apparatus, a semiconductor chip 20 is mounted by means of an electrically conductive resin layer 1a on a substrate (circuit substrate) 10 made from silicon or the like and having circuit electrodes (referred to below as lands) 11 which are terminals. The lands 11 on the substrate 10 of the semiconductor device are patterned so as to correspond to electrode pads (terminals) 21 provided on the semiconductor chip 20, and the lands 11 and electrode pads 21 oppose each other. Electrode pads 21 provided on the surface of the semiconductor chip 20 are provided in order to connect an unillustrated integrated circuit formed on the semiconductor chip 20 to the exterior. Bumps made of solder, gold, or the like may be formed in advance on the electrode pads 21.

As shown in FIG. 1, in this semiconductor device, the lands 11 of the substrate 10 and the electrode pads 21 on the surface of the semiconductor chip 20 are electrically connected with each other through the electrically conductive resin layer 1a. This electrically conductive resin layer 1a contains an electrically conductive substance 3a in an electrically insulating cured resin 2a, and the electrically conductive substance 3a contained in the electrically conductive layer 1a electrically connects the electrode pads 21 and the lands 11. This electrically conductive substance 3a, which will be described in detail later on, is formed by melting and agglomerating and joining a plurality of electrically conductive particles 3b.

A joining method for joining the lands 11 on the substrate 10 and the electrode pads 21 on the semiconductor chip 20 in this semiconductor device will be explained based on FIG. 2 and FIG. 3.

Figure 2A:
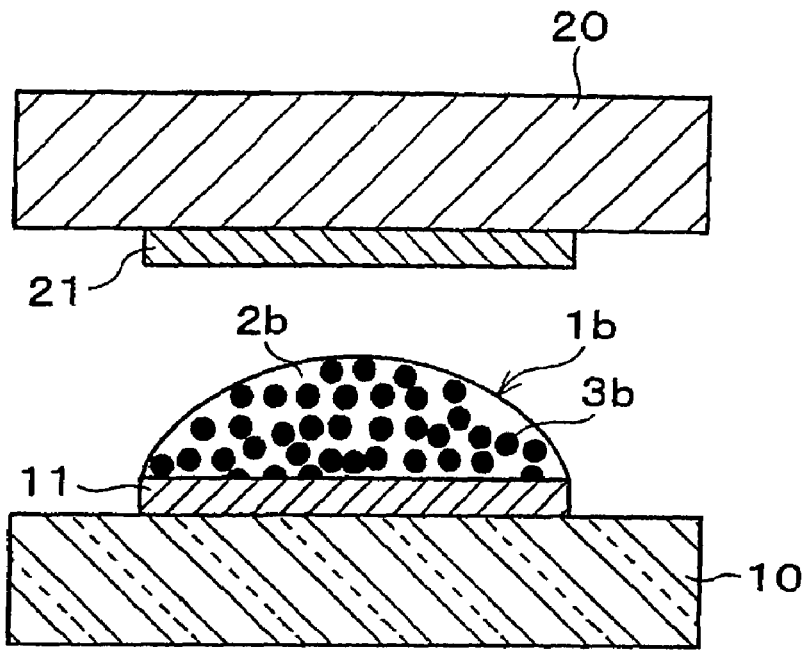
FIGS. 2(a) and 2(b) are cross-sectional views showing methods of connecting opposing electrodes.

First, a semiconductor chip 20 on which electrode pads 21 are formed and a substrate 10 on which lands 11 are patterned so as to correspond to the electrode pads 21 are prepared. The surface of the electrode pads 21 and the surface of the lands 11 may be subjected to treatment such as washing, polishing, plating, or surface activation so as to obtain good contact with the below-described "wetted" electrically conductive particles. As shown in FIG. 2(a), an electrically conductive adhesive (anisotropic electrically conductive resin composition) 1b in which electrically conductive particles 3b are dispersed in a resin (resin component) is supplied to atop the substrate 10 or the lands 11 of the substrate 10. As will be described in detail later on, the resin 2b contained in the electrically conductive adhesive 1b is preferably not completely cured at the molten temperature (melting point) of the electrically conductive particles 3b, and preferably it has a viscosity such that a portion of the electrically conductive particles can flow.

Figure 2B:
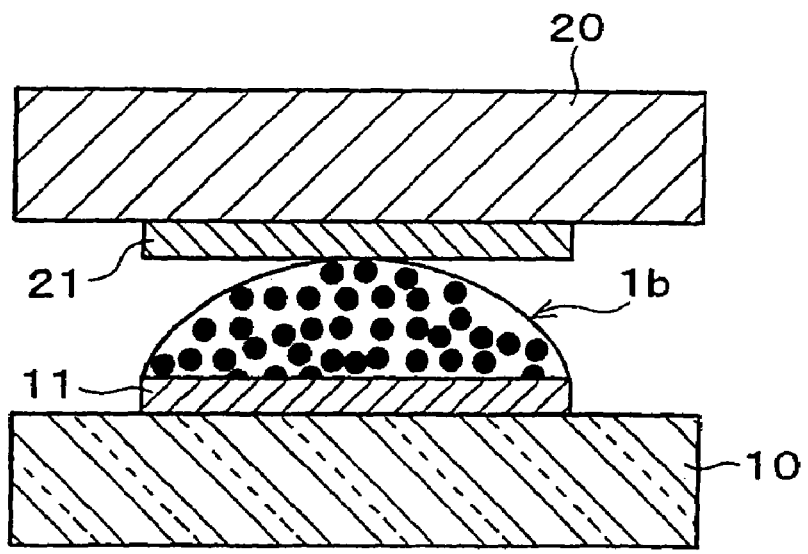

The electrically conductive adhesive 1b can be a film, paste, powder, or the like, and there is no particular limitation to its form. Therefore, the electrically conductive adhesive 1b can be supplied to atop the substrate 10 or the lands 11 by a supply method suited to its form. Namely, in the case of an electrically conductive adhesive 1b in the form of a film, it can be placed directly on the substrate 10 or the lands 11, or it can be transferred thereto. If the electrically conductive adhesive 1b is in the form of a paste, it may be dripped directly onto the substrate 10 or the lands 11, or it may be applied by screen printing, offset printing, spin coating, or other method. In FIGS. 2(a) and 2(b), the case is shown in which an electrically conductive adhesive 1b in the form of a paste is applied.

The lands 11 on the substrate 10 are aligned with the electrode pads 21 on the semiconductor chip 20, and then, as shown in FIG. 2(b), the semiconductor chip 20 is placed on the electrically conductive adhesive 1b supplied to atop the substrate 10. At this time, an unillustrated spacer may be placed on the substrate 10 so that there is a least a prescribed distance between the lands 11 of the substrate 10 and the electrode pads 21 of the semiconductor chip 20 (referred to below as opposing electrodes), and the semiconductor chip 20 may be placed so that the spacer is sandwiched.

The distance between the opposing electrodes when the semiconductor chip 20 is placed on the substrate 10 is made such that the electrically conductive adhesive 1b on the substrate 10 or the lands 11 contacts the electrode pads 21 of the semiconductor chip 20. In other words, the electrically conductive adhesive 1b which is supplied to the substrate 10 or the lands 11 can be supplied so that at least a prescribed distance is obtained between the opposing electrodes.

Figure 3A:
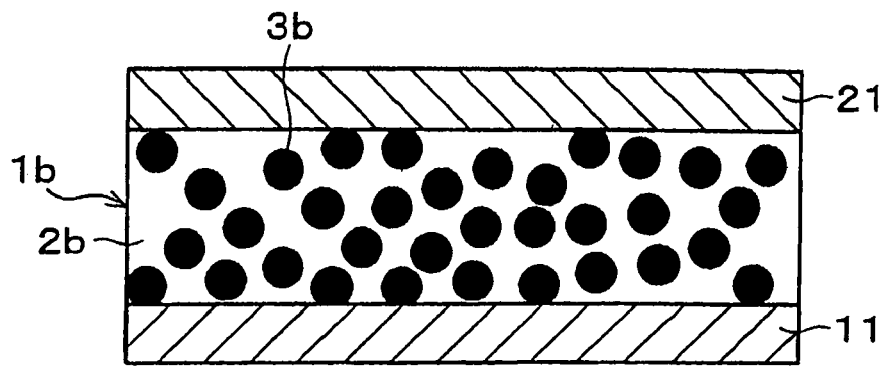
FIGS. 3(a)-3(c) are cross-sectional views for explaining the bonding mechanism of an electrically conductive adhesive supplied between the opposing electrodes.

In the above-described state in which the substrate 10 and the semiconductor chip 20 oppose each other through the electrically conductive adhesive 1b, as shown in FIG. 3(a), the electrically conductive particles 3b are uniformly dispersed in the electrically conductive adhesive 1b between the lands 11 and the electrode pads 21 (between the opposing electrodes).

Figure 3B:
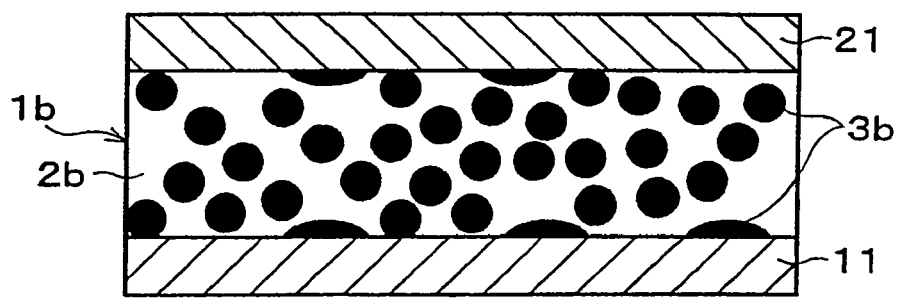

As shown in FIG. 3(a), after the lands 11 and the electrode pads 21 are positioned so as to sandwich the electrically conductive adhesive 1b, the substrate 10 and the semiconductor chip 20 (see FIG. 2(b)) are gradually heated to a temperature of at least the melting point of the electrically conductive particles 3b. As a result of this heating, the resin 2b contained in the electrically conductive adhesive 1b preferably achieves a viscosity such that the electrically conductive particles 3b can easily move in the resin 2b without complete curing taking place. When the heating is continued and the temperature reaches the melting point of the electrically conductive particles 3b, as shown in FIG. 3(b), the electrically conductive particles 3b melt, and electrically conductive particles 3b which are positioned in the vicinity of each other move in the resin 2b and agglomerate.

Figure 3C:
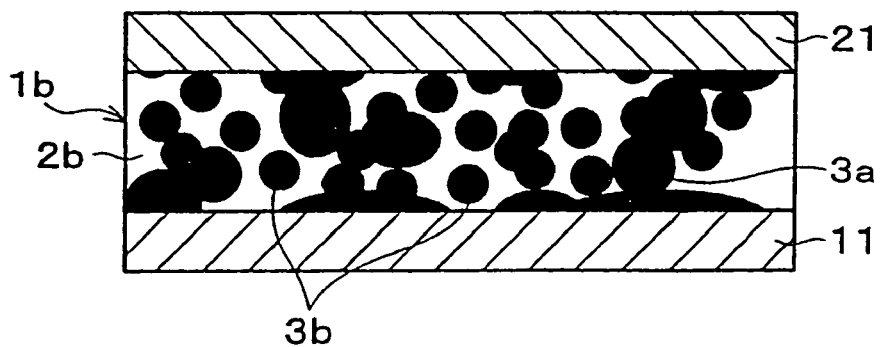

At this time, a "wetted" state is achieved in which the electrically conductive particles 3b which have melted spread on the surface of the lands 11 and the surface of the electrode pads 21 (both collectively referred to below as electrode surfaces). Then, the other electrically conductive particles 3b contained in the electrically conductive adhesive 1b gather with the "wetted" electrically conductive particles 3b on the electrode surfaces, and as shown in FIG. 3(c), these electrically conductive particles 3b melt and agglomerate and chemically bond. As a result, the opposing electrodes are joined by the electrically conductive substance 3a comprising a plurality of electrically conductive particles bonded to each other, and an electrically conducting path is formed between the opposing electrodes. In this manner, an electrically conductive substance 3a which is chemically bonded is formed between opposing electrodes, and a highly-reliable connection having a resistance of the same level as with metal bonding can be achieved.

When the temperature reaches the melting point of the electrically conductive particles 3b, pressure can be applied so that the semiconductor chip 20 approaches the substrate 10 to decrease the distance between opposing electrodes. Namely, the semiconductor chip 20 and the substrate 10 can be pressed towards each other through the electrically conductive adhesive 1b to decrease the distance between the opposing electrodes. As a result, it becomes easier for other electrically conductive particles to agglomerate with the electrically conductive particles 3b which have "wetted" the electrode surfaces, and it becomes possible to form a highly reliable electrical connection between opposing electrodes. There is no particular limit on the distance between opposing electrodes when the substrate 10 is made to approach the semiconductor chip 20, but it is preferably set so as to be from several times to several tens of times the particle diameter of the electrically conductive particles 3b, and specifically, it is preferably set to be from at least 1 micrometer (μm) to at most 500 micrometers.

As described above, heating may be performed up to the melting point of the electrically conductive particles 3b, but in order to fully melt the electrically conductive particles 3b and obtain highly reliable electrical conductivity between opposing electrodes, heating is preferably performed to a temperature higher than the melting point of the electrically conductive particles 3b. Specifically, if heating is performed to a temperature around 10-30° C. higher than the melting point of the electrically conductive particles 3b, the electrically conductive particles can be adequately melted and good conductivity between opposing electrodes can be obtained.

As described above, after the electrically conductive substance 3a shown in FIG. 3(c) is formed by melting the electrically conductive particles 3b and a conductive path is guaranteed between opposing electrodes, the resin 2b contained in the electrically conductive adhesive 1b which is applied between the substrate 10 and the semiconductor chip 20 is completely cured. As a result, as shown in FIG. 1, an electrically conductive resin layer 1a having an electrically conductive material 3a formed within a cured resin 2a is obtained, and the substrate 10 and the semiconductor chip 20 are secured.

The curing conditions for curing the resin 2b contained in the electrically conductive adhesive 1b can be suitably set in accordance with the type and properties of the resin 2b which is used. For example, when using a thermosetting resin, heating can be performed to the curing temperature of the resin 2b, and when using a thermoplastic resin, cooling can be formed to a temperature at which the resin is cured. When using a photo-setting resin, a polymerization reaction can be started by irradiation with light.

In this manner, by curing the resin 2b in an electrically conductive adhesive 1b which is supplied between the substrate 10 and the semiconductor chip 20, conductivity between opposing electrodes can be guaranteed. In addition, as a result of the curing of the resin 2b, the substrate 10 and the semiconductor chip 20 can be secured with an adequate mechanical strength.

An electrically conductive adhesive 1b used for mounting a semiconductor chip 20 on a substrate 10 in the above-described joining method will be explained (see FIG. 3(a)). The electrically conductive adhesive 1b contains at least electrically conductive particles 3b and a resin 2b, and if necessary it may contain substances other than the electrically conductive particles 3b and the resin 2b.

There is no particular restriction on the electrically conductive particles 3b contained in the electrically conductive adhesive 1b. With a semiconductor device, it is preferable to perform heating at 250° C. or below in order to prevent thermal degradation of semiconductor chips or electronic parts or the like mounted on the substrate 10. Therefore, in order to make it possible to carry out heating at 250° C. or below, electrically conductive particles 3b having a melting point of at most 250° C. are preferably used.

Specific examples of such electrically conductive particles 3b are metals such as tin (Sn), indium (In), bismuth (Bi), copper (Cu), zinc (Zn), lead (Pb), cadmium (Cd), gallium (Ga), silver (Ag), and thallium (Tl), and alloys of these metals. Examples of such alloys are, for example, Sn-48In, Sn-57Bi-1Ag, Sn-9Zn, Sn-8Zn-3Bi, and Sn-3.5Ag (in each case the proportion in the composition), or the metals and alloys shown in Table 1. Table 1 also shows the melting point of each metal and alloy.

TABLE 1

| Metal (proportion in the composition) | | | | | | | | | Melting Point (° C.) |
|---|---|---|---|---|---|---|---|---|---|
| Sn | Pb | Bi | In | Cd | Ga | Zn | Tl | Ag | |
| | | | 24 | | 76 | | | | 16 |
| 8 | | | | | 92 | | | | 20 |
| | | | | | 95 | | 5 | | 25 |
| | | | | | 100 | | | | 29.8 |
| 10.8 | 22.4 | 40.6 | 18 | 8.2 | | | | | 46.5 |
| 8.3 | 22.6 | 44.7 | 19.1 | 5.3 | | | | | 47.2 |
| 12 | 18 | 49 | 21 | | | | | | 58 |
| 16 | | 33 | 51 | | | | | | 61 |
| 13.1 | 27.3 | 49.5 | | 10.1 | | | | | 70 |
| 12.5 | 25 | 50 | | 12.5 | | | | | 70-74 |

TABLE 1-continued

| Metal (proportion in the composition) | | | | | | | | | Melting Point (°C.) |
|---|---|---|---|---|---|---|---|---|---|
| Sn | Pb | Bi | In | Cd | Ga | Zn | Tl | Ag | |
|  |  | 34 | 66 |  |  |  |  |  | 72.4 |
| 17 |  | 57 | 26 |  |  |  |  |  | 79 |
|  | 40.2 | 51.7 |  | 8.1 |  |  |  |  | 91.5 |
| 42 |  |  | 44 | 14 |  |  |  |  | 93 |
| 18.7 | 31.3 | 50 |  |  |  |  |  |  | 95 |
| 16 | 32 | 52 |  |  |  |  |  |  | 96 |
| 25 | 25 | 50 |  |  |  |  |  |  | 96-98 |
| 26 |  | 53.5 |  | 20.5 |  |  |  |  | 103 |
| 22 | 28 | 50 |  |  |  |  |  |  | 96-110 |
| 48 |  |  | 52 |  |  |  |  |  | 117 |
|  | 43.5 | 56.5 |  |  |  |  |  |  | 125 |
|  |  |  | 75 | 25 |  |  |  |  | 127.7 |
| 43 |  | 57 |  |  |  |  |  |  | 139 |
|  |  | 62 |  | 38 |  |  |  |  | 144 |
| 49.8 | 32 |  |  | 18.2 |  |  |  |  | 145 |
|  |  |  | 100 |  |  |  |  |  | 156.4 |
| 57 |  |  |  |  |  |  | 43 |  | 170 |
| 97 |  |  |  |  |  | 3 |  |  | 176 |
| 62.5 | 36 |  |  |  |  |  |  | 1.5 | 178 |
| 63 | 34 | 3 |  |  |  |  |  |  | 180 |
| 61.9 | 38.1 |  |  |  |  |  |  |  | 183 |

The electrically conductive particles 3b preferably have a particle diameter of at most 100 micrometers and more preferably at most 50 micrometers. The lower limit on the particle diameter is preferably at least 1 micrometer and more preferably at least 3 micrometers. In general, the upper limit on the particle diameter of the electrically conductive particles 3b depends on the dimensions and structure of the electrodes in the form of the electrode pads and lands. Normally, in order to guarantee insulation between adjoining electrodes, they preferably have a diameter of at most 0.5 times the pitch of the electrodes. In contrast, if the lower limit on the particle diameter of the electrically conductive particles 3b is less than 1 micrometer, it becomes difficult for other electrically conductive particles 3b to agglomerate with the electrically conductive particles 3b which have "wet" the electrode surface.

There is no particular limit on the shape of the electrically conductive particles 3b, and various shapes can be used such as a spherical shape, a flattened spherical shape, a plate shape, or an irregular shape.

The proportion by volume of the electrically conductive particles 3b contained in the electrically conductive adhesive 1b preferably has a lower limit of at least 20 volume percent and more preferably at least 30 volume percent. The upper limit on the proportion by volume of the electrically conductive particles 3b is preferably at most 70 volume percent and more preferably at most 60 volume percent.

If the proportion by volume of the electrically conductive particles 3b in the electrically conductive adhesive 1b is less than 20 volume percent, depending on the weight ratio, dispersion of the electrically conductive particles 3b in the resin 2b is impeded. In contrast, if the proportion by volume exceeds 70 volume percent, the electrically conductive particles 3b are too densely disposed, so there is the possibility of the state of mixing of the electrically conductive particles 3b and the resin 2b becoming nonuniform.

There are no particular restrictions on the resin 2b as long as it has electrically insulating properties and it is not completely cured at the melting temperature of the electrically conductive particles 3b contained in the electrically conductive adhesive 1b. In addition, the percent of curing of the resin 2b at the melting temperature of the electrically conductive particles 3b is preferably less than 100% so that the electrically conductive particles 3b can flow inside the resin 2b.

There are no particular restrictions on the resin 2b as long as it can satisfy the above requirements. For example, one or two or more of a thermosetting resin, a thermoplastic resin, a photo-setting resin, or the like can be used.

Examples of a thermosetting resin are an epoxy resin, a urethane resin, an acrylic resin, a silicone resin, a phenolic resin, a melamine resin, an alkyd resin, a urea resin, an acrylic resin, and an unsaturated polyester resin.

Examples of a thermoplastic resin are a vinyl acetate resin, a polyvinyl butyral resin, a vinyl chloride resin, a styrene resin, a vinyl methyl ether resin, a urethane resin, a glyptal resin, an ethylene-vinyl acetate copolymer resin, a styrene-butadiene copolymer resin, a polybutadiene resin, and a polyvinyl alcohol resin.

The photo-setting resin is a mixture of a photopolymerizable monomer or a photopolymerizable oligomer with a photo-polymerization activator or the like. It starts a polymerization action when irradiated with light. Examples of a photopolymerizable monomer or a photopolymerizable oligomer are an acrylate monomer, a methacrylate monomer, an ethyl acrylate, a urethane acrylate, an epoxy acrylate, an amino resin acrylate, an unsaturated polyester, and a silicone resin.

A surface activating resin having a surface activating effect which activates the surface of the electrically conductive particles 3b or the surface of the electrodes may be used as the resin 2b. A surface activating resin is one which has reducing properties to reduce the surface of the electrically conductive particles 3b or the surface of the electrodes. For example, it refers to a resin which frees an organic acid when heated. If such a surface activating resin is used, the surface of the electrically conductive particles 3b or the surface of the electrodes is activated, good "wetting" of the electrically conductive particles 3b on the electrode surfaces is achieved, it becomes easier for the electrically conductive particles 3b to bond to each other, and electrically conductive particles with a larger particle diameter can be obtained.

Examples of a surface activating resin are Penguin Cement RD-0205 and RD-0128, which are epoxy resins (manufactured by Sunstar Giken).

The melting point of the electrically conductive particles 3b contained in the electrically conductive adhesive 1b and the curing temperature of the resin 2b can be determined by differential thermal analysis (DSC). Namely, based on the peak of the spectrum obtained by differential thermal analysis, the melting point of the electrically conductive particles 3b and the curing temperature of the resin 2b are determined, and the combination of the electrically conductive particles 3b and resin 2b to be used is determined.

The electrically conductive adhesive 1b may contain a flux, a surface activating agent, a hardener, or the like as substances in addition to the electrically conductive particles 3b and the resin 2b.

Examples of a flux are a reducing agent such as a resin, an inorganic acid, an amine, or an organic acid. The flux reduces surface foreign matter such as oxides on the surface of the molten electrically conductive particles 3b, the surface of the lands 11, and the surface of the electrode pads 21 and thereby converts them into soluble and meltable compounds and removes them. In addition, it covers the surface of the electrically conductive particles 3b, the surface of the lands 11, and the surface of the electrode pads 21 which have been cleaned by removal of surface foreign matter and prevents them from reoxidizing.

The flux preferably has a boiling point which is higher than the melting point of the electrically conductive particles 3b and lower than the maximum temperature at the time of carrying out heat treatment for bonding opposing electrodes. The content of the flux in the electrically conductive adhesive 1b is preferably at most 20 weight percent and more preferably at most 10 weight percent. If the content of the flux exceeds 20 weight percent, it becomes easy for voids to develop, and these become a cause of a decrease in the bonding properties in the joint portion, which is undesirable.

Examples of the surface activating agent are a glycol such as ethylene glycol or glycerin; an organic acid such as maleic acid or adipic acid; an amine compound such as an amine, an amino acid, an organic acid salt of an amine, or a halogen salt of an amine; and an inorganic acid or an inorganic acid salt. It dissolves and removes surface foreign matter such as oxides from the surface of the molten electrically conductive particles 3b, the surface of the lands 11, and the surface of the electrode pads 21.

The surface activating agent preferably has a boiling point which is higher than the melting point of the electrically conductive particles 3b, and it preferably evaporates at a temperature lower than the highest temperature during heat treatment for carrying out bonding of opposing electrodes. The content of the surface activating agent in the electrically conductive adhesive 1b is preferably at most 20 weight percent and more preferably at most 10 weight percent.

Examples of the curing agent are dicyandiamide and imidazole. It promotes the curing of the epoxy resin.

Electrical connection of opposing electrodes using the electrically connecting adhesive explained above is not limited to use in chip bonding such as bonding of the electrode pads 21 on a semiconductor chip 20 to lands 11 on a substrate 10. Namely, it can be utilized for various types of electrical bonding such as bonding to the surface of the substrate 10 on the side opposite from the side on which lands 11 are formed, joining of electronic parts such as optical parts to a substrate 10, and mounting a TCP (tape carrier package) for a liquid crystal display. In particular, if an electrically conductive adhesive containing electrically conductive particles 3b having a low melting point is used, it can be applied to electronic parts having a low resistance to heat such as light emitting diodes and light receiving optical elements. In addition, when bonding of optical elements is carried out by the above-described method, there is no occurrence of an opaque area, so transparency can be guaranteed.

In this manner, the method of electrically connecting opposing electrodes explained above can be used for various types of terminals for connecting to the exterior such as electrodes provided on a semiconductor chip, electrodes of all types of electronic parts such as optical parts and discrete parts, and electrodes provided on circuit substrates.

EXAMPLES

Examples of the present invention will be explained based on FIGS. 4-10. In these examples, an alloy having a Sn-48In composition was used as electrically conductive particles contained in an electrically conductive adhesive, and a thermosetting resin was used as a resin, but the present invention is not limited to these.

Differential Thermal Analysis (DSC)

DSC (Differential Scanning Calorimeter) analysis was performed on the following electrically conductive particles and resins used in an electrically conductive adhesive as well as on the electrically conductive adhesive. An analyzer made by Perkin Elmer (Model DSC-7) was used as an analyzer.

(1) Electrically Conductive Particles

Figure 4:
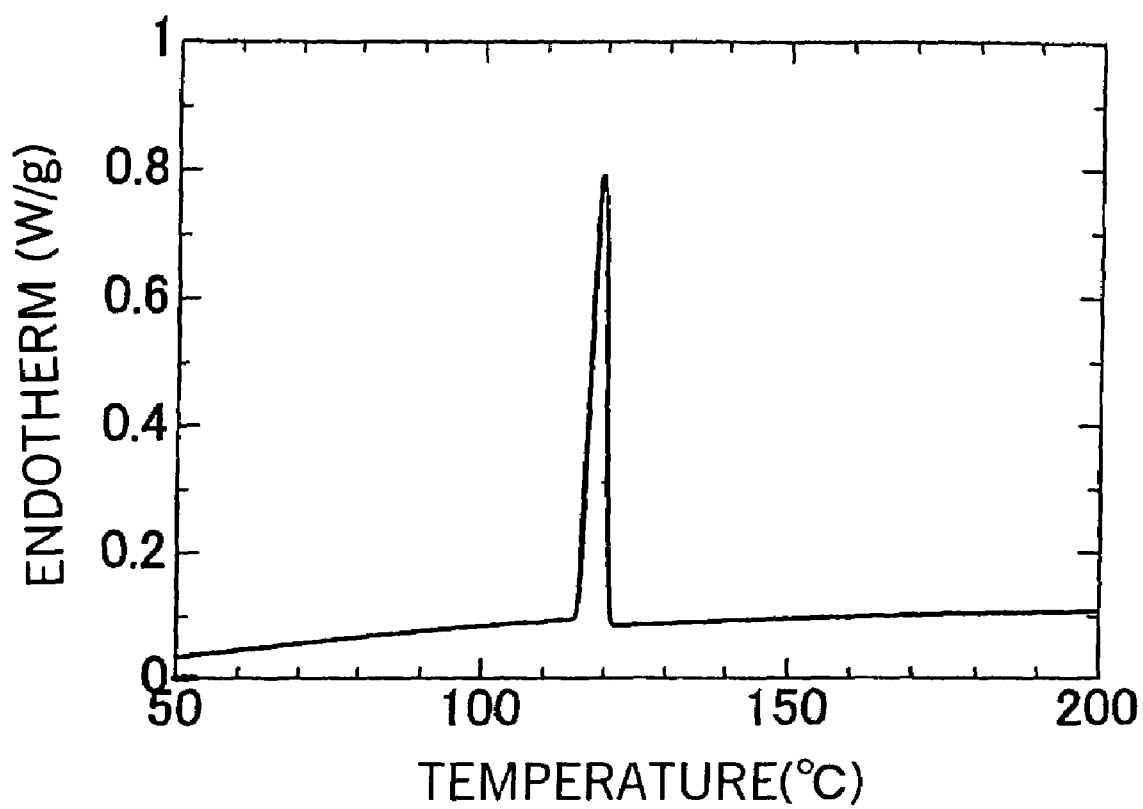
FIG. 4 is a differential thermal analysis spectrum of an alloy containing a Sn-48In composition.

An alloy having a composition of Sn-48In was used as electrically conductive particles. DSC analysis was performed at a rate of temperature increase of 5° C. per second. The results are shown in FIG. 4. From analysis of FIG. 4, it was determined that the temperature at the start of melting of the alloy was 115.93° C. and the temperature of the peak of the spectrum was 119.45° C.

(2) Resin

Figure 5A:
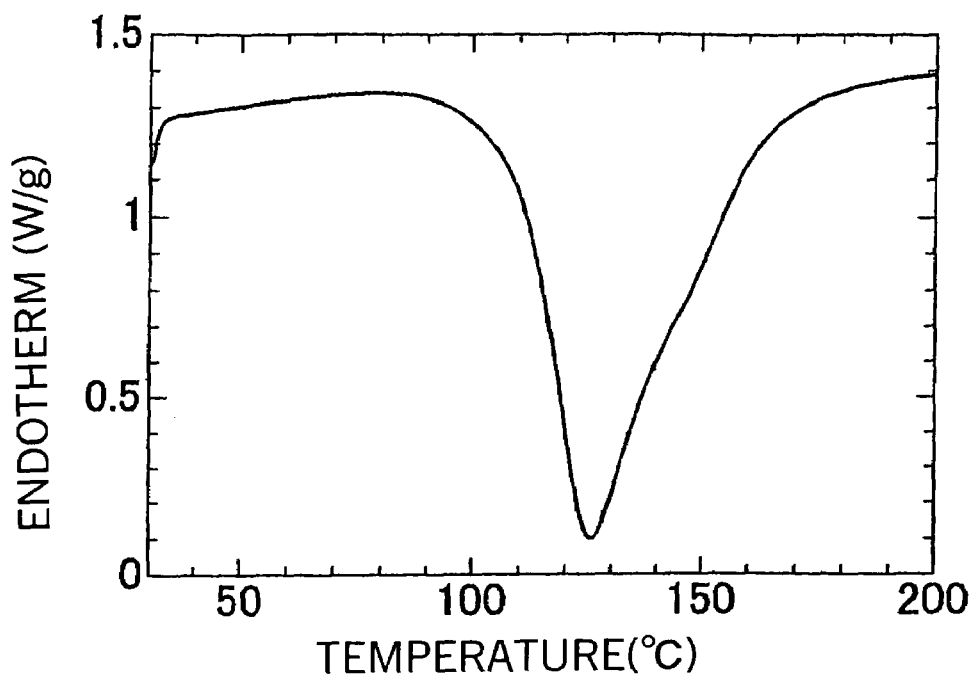
FIG. 5(a) is a differential thermal analysis spectrum of Epicron SR-A.
Figure 5B:
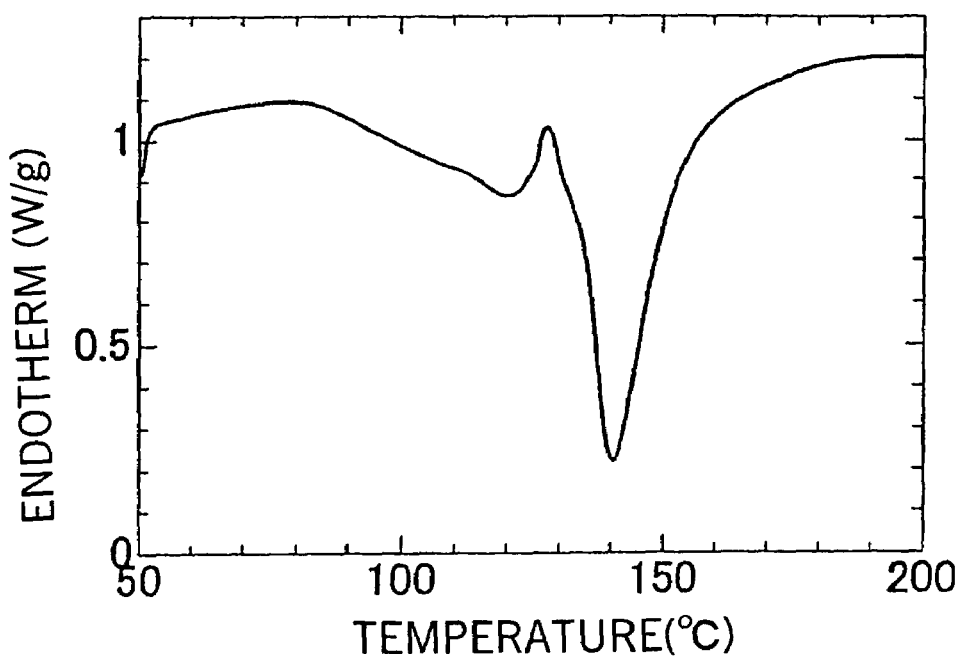
FIG. 5(b) is a differential thermal analysis spectrum of Penguin Cement RD-0205.

DSC analysis was carried out at a rate of temperature increase of 5° C. per second on Epicron SR-A (manufactured by Dainippon Ink and Chemicals) as an epoxy resin not having reducing properties and on Penguin Cement RD-0205 (manufactured by Sunstar Giken) as an epoxy resin having reducing properties. The results are shown in FIGS. 5(a) and 5(b), respectively. The temperature at the start of curing of each of the above resins and the temperature at the peak of the spectrum (the peak temperature) were found from analysis of FIGS. 5(a) and 5(b) and are shown in Table 2.

TABLE 2

| Resin | Temperature at start of curing (° C.) | Peak temperature (° C.) |
|---|---|---|
| Epicron SR-A | 109.31 | 125.88 |
| Penguin Cement RD-0205 | 81.95 | 140.70 |

(3) Electrically Conductive Adhesive

Figure 6:
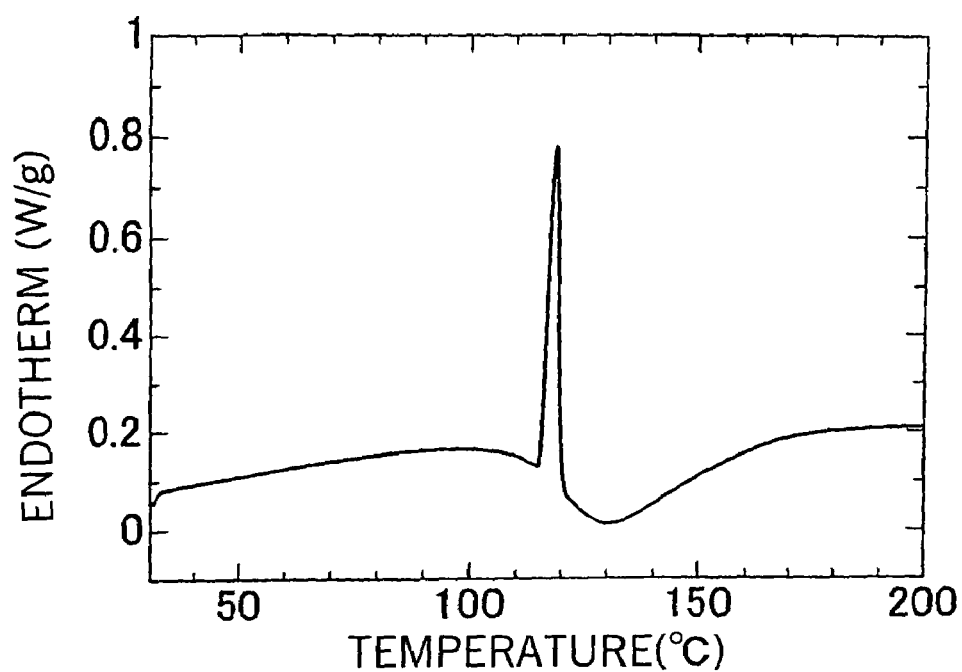
FIG. 6 is a differential thermal analysis spectrum of an electrically conductive adhesive containing an alloy having a composition of Sn-48In and Epicron SR-A.

An electrically conductive adhesive was prepared by mixing (1) the above-described alloy (0.843 g) and (2) the above-described Epicron SR-A (0.157 g) so that the content by volume of the electrically conductive particles was 50%, and DSC analysis of the electrically conductive adhesive was carried out at a rate of temperature increase of 5° C. per second. The results are shown in FIG. 6. As shown in FIG. 6, the melting temperature of the alloy within this electrically conductive adhesive was at the peak position of the spectrum, which was 119° C., and the results were nearly the same as in FIG. 4.

Example 1

Copper plates measuring 10 mm×10 mm×1 mm were polished with emery paper and then polished with a buff. Surface treatment was then carried out on a pair of the polished plates by deoxidizing with 6% hydrochloric acid and degreasing by ultrasonic cleaning using acetone. Then, a Sn-48In alloy as electrically conductive particles and Epicron SR-A as a resin were mixed to prepare an electrically conductive adhesive in which the content of the electrically conductive particles was 50% by volume. This electrically conductive adhesive was applied to the surface of one of the copper plates, and spacers made of stainless steel spheres were placed on the surface of this copper plate. Then, the other copper plate was placed atop the electrically conductive adhesive applied to the first copper plate, a weight of 100 g was placed atop the second copper plate, and after sitting for several seconds, the weight was removed and the electrically conductive particles within the electrically conductive adhesive in the resulting sample (referred to below as the sample before heating) were observed. The results are shown in FIG. 7.

Figure 8:
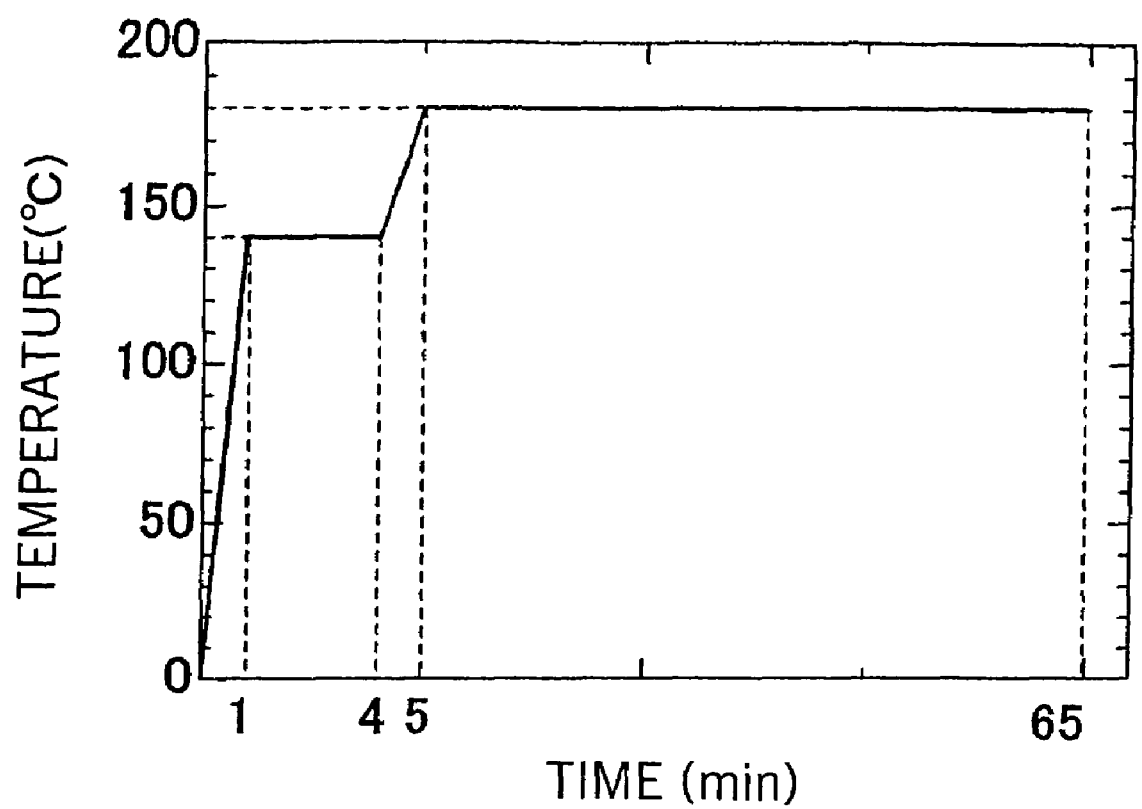
FIG. 8 is a graph showing the change in the temperature to which a reflow oven is set.
Figure 9A:
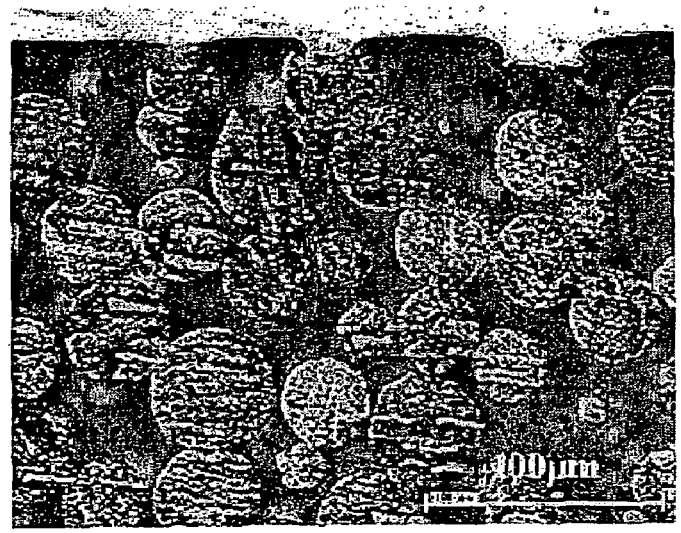
FIGS. 9(a) and 9(b) are images of a cross section of a sample after heating obtained in Example 1.
Figure 9B:
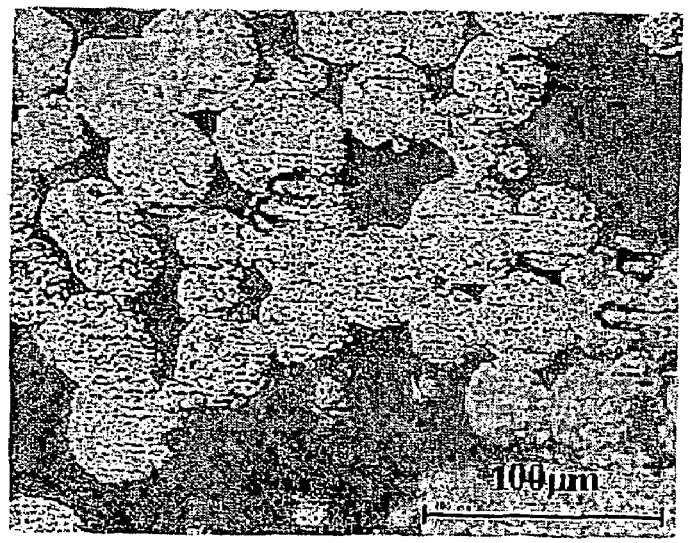

The sample before heating was placed into a reflow oven, and in accordance with the temperature profile shown in FIG. 8, it was first heated for one minute up to 140° C., it was then maintained at 140° C. for three minutes, then it was further heated for one minute up to 180° C., and then it was maintained at 180° C. for one hour. As a result, the electrically conductive particles were melted, the resin was then cured, and a sample after heating was obtained. The results are shown in FIGS. 9(a) and 9(b).

Figure 7:
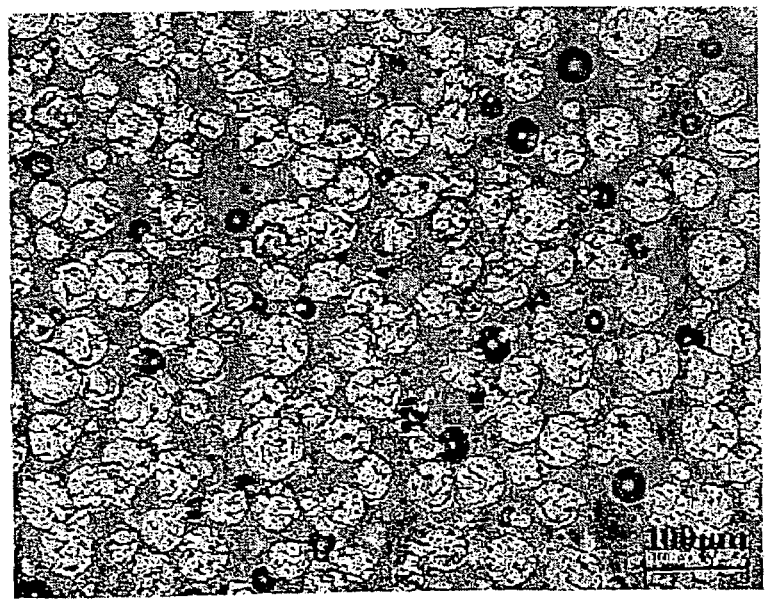
FIG. 7 is an image of a cross section of a sample prior to heating obtained in Example 1.

As shown in FIG. 7, in the sample before heating, the electrically conductive particles are uniformly dispersed in the resin. In contrast, as shown in FIG. 9(a), it can be seen that in the sample after heating in which the electrically conductive adhesive has cured, the electrically conductive particles "wet" the surface of the copper plates, and the copper plates and the electrically conductive particles are connected. As shown in FIG. 9(b), it can be seen that due to the melting of the electrically conductive particles by heating, metallic bonding between the electrically conductive particles develops. As a result, it can be seen that the pair of copper plates are electrically connected by the electrically conductive particles.

Example 2

A sample after heating was obtained by the same technique as in Example 1 except for using an electrically conductive adhesive obtained by mixing a Sn-48In alloy as electrically conductive particles and Penguin Cement RD-0205 as a resin so that the content of the electrically conductive particles was 30 volume percent.

Figure 10A:
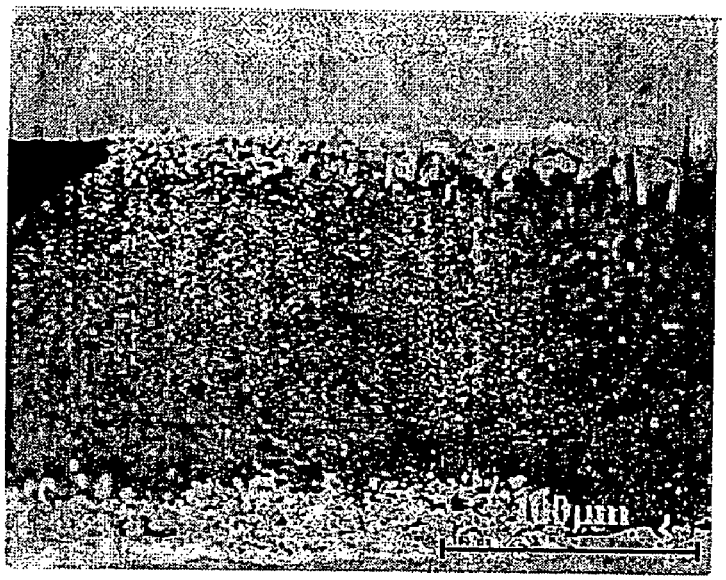
FIGS. 10(a) and 10(b) are images of a cross section of a sample after heating obtained in Example 2.
Figure 10B:
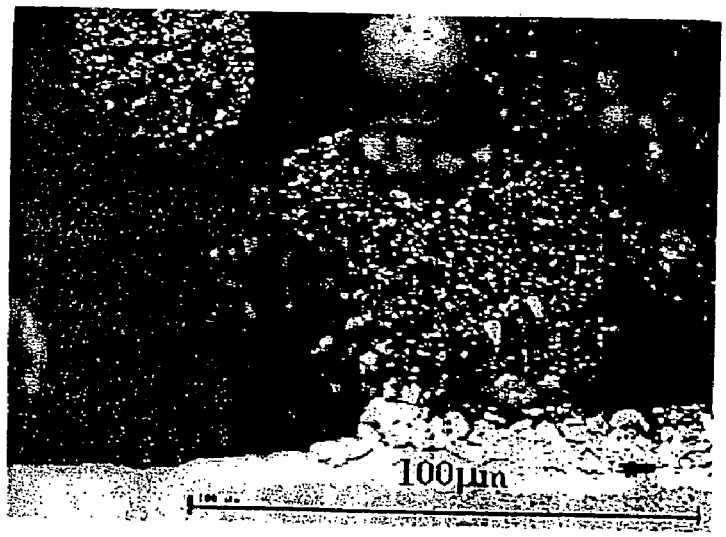

The results are shown in FIGS. 10(a) and 10(b). As shown by FIGS. 10(a) and 10(b), it can be seen that an electrically conducting path was formed by a melt of the electrically conductive particles between the pair of copper plates.

Example 3

In order to investigate the surface activating effect of a resin contained in an electrically conductive adhesive, the distance between copper plates was controlled to 300 micrometers, and the molten state of electrically conductive particles was investigated.

Namely, 10 mm×10 mm×1 mm copper plates were polished by the same technique as in Example 1 and surface treatment was carried out. Then, a Sn-48In alloy (0.8454 g) as electrically conductive particles and Penguin Cement RD-0205 (0.1546 g) as a resin were mixed so that the content of electrically conductive particles was 50 volume percent to prepare an electrically conductive adhesive, and this electrically conductive adhesive was applied to the surface of one of the copper plates. In order to control the distance between the copper plates to 300 micrometers, spacers in the form of stainless steel balls with a diameter of 300 micrometers were placed on the surface of the one copper plate. Then, the other copper plate was placed on top of the electrically conductive adhesive which was applied to the first copper plate, and a weight of 100 g was placed on top of the second copper plate, and after sitting for a few seconds, the weight was removed. Then, in the same manner as in Example 1, the sample was placed into a reflow oven, and heating was performed according to the temperature profile shown in FIG. 8 to obtain a sample after heating. The results are shown in FIG. 11.

Figure 11:
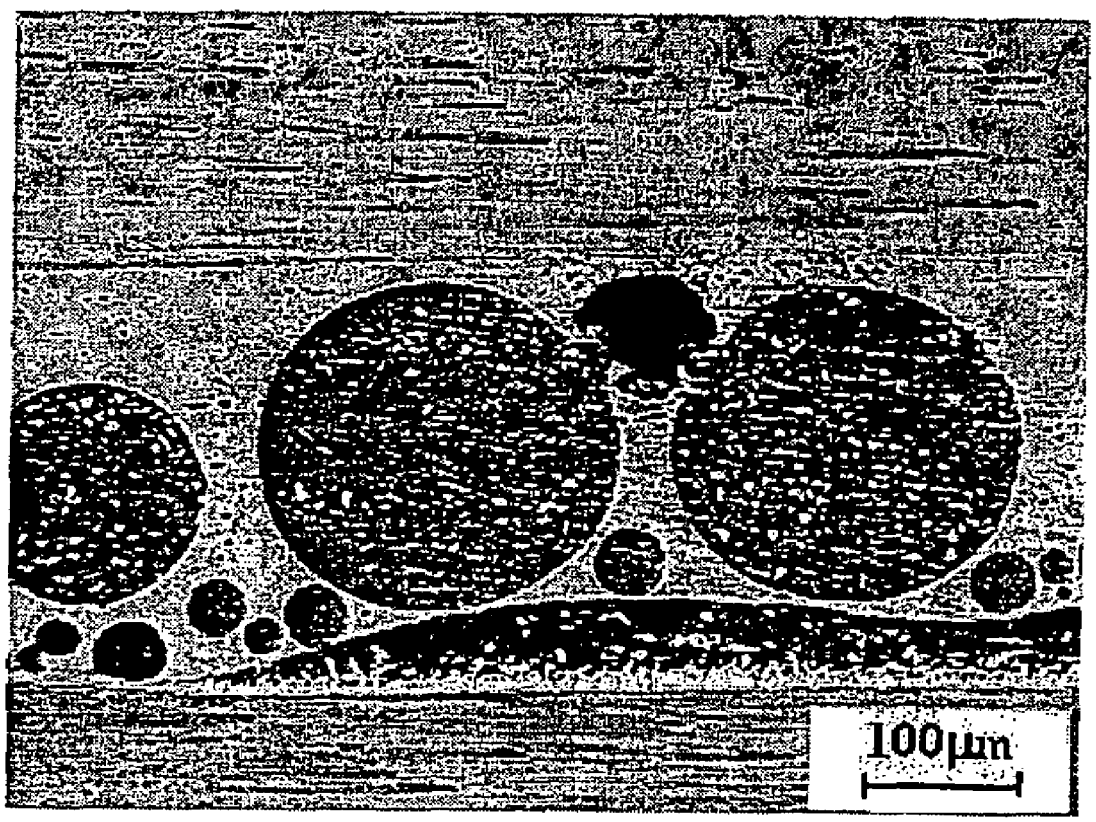
FIG. 11 is an image of a cross section of a sample after heating obtained in Example 3.

As shown in FIG. 11, electrically conductive particles having a relatively large particle diameter can be seen inside the electrically conductive adhesive supplied to between the copper plates, and the phenomenon of "wetting" of the surface of the copper plates by the electrically conductive particles can be seen, so it is thought that the electrically conductive particles are bonded to each other by the heat treatment. Accordingly, when the resin contained in the electrically conductive adhesive has reducing properties, the surfaces of the copper plates and the surfaces of the electrically conductive particles are activated, and it is thought that bonding of the electrically conductive particles to each other and bonding of the electrically conductive particles to the surfaces of the copper plates can be facilitated.

Example 4

Example 4 will be explained based on FIGS. 12-14.

In this example, in order to mount a semiconductor chip 20 in a semiconductor device, the mode of supplying an electrically conductive adhesive 1b is different from that in FIG. 2(a) and FIG. 2(b). FIG. 2(a) shows a mode in which the electrically conductive adhesive 1b is initially applied only on top of lands 11, and the electrically conductive adhesive 1b is disposed only on the opposing electrodes in the electrode placement step (terminal placement step) in which the electrode pads 21 and the lands 11 are placed so as to oppose each other with the electrically conductive adhesive 1b therebetween.

Figure 12A:
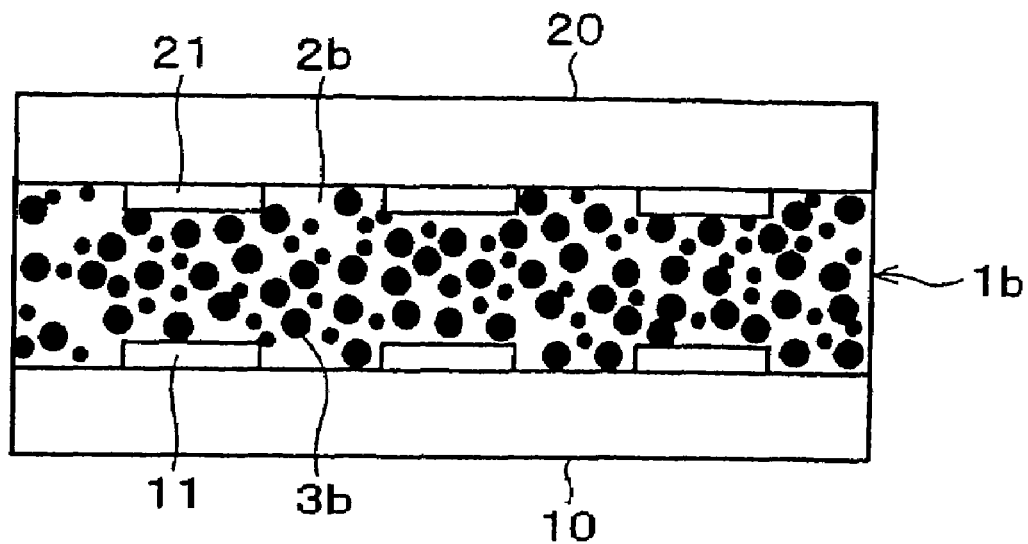
FIGS. 12(a) and 12(b) are cross-sectional views showing the state of connection between opposing electrodes by a method of mounting a semiconductor device according to Example 4.

In contrast, in this example, in the electrode placement step, as shown in FIG. 12(a), the electrically conductive adhesive 1b is supplied such that the electrically conductive adhesive 1b fills the entire space sandwiched between the substrate 10 and the semiconductor chip 20, including the space between the opposing electrode pads 21 and lands 11.

The electrically conductive adhesive 1b is initially applied not only to the lands 11 but to nearly the entirety of the opposing surfaces of the substrate 10 and the semiconductor chip 20 so as to perform filling by the electrically conductive adhesive 1b as shown in above-described FIG. 12(a). After the electrically conductive adhesive 1b is applied to the substrate 10, in the electrode placement step, the semiconductor chip 20 is placed so as to oppose the substrate 10, and the electrically conductive adhesive 1b fills the entire space sandwiched between the substrate 10 and the semiconductor chip 20.

Then, a process is carried out in which heating is performed to a temperature higher than the melting point of the electrically conductive particles 3b of the electrically conductive adhesive 1b and at which the resin 2b of the electrically conductive adhesive 1b is not cured, and the electrically conductive particles 3b are agglomerated on the surfaces of the opposing electrodes utilizing "wetting", and the distance between opposing electrodes is narrowed to provide conductivity. Preferably, the resin 2b is cured at a higher temperature.

Figure 12B:
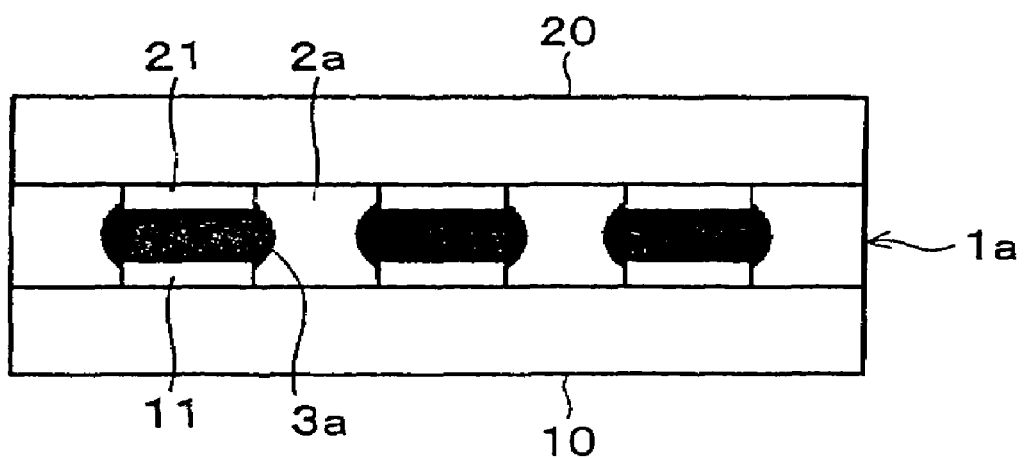

Except for the mode of supplying the electrically conductive adhesive 1b explained with respect to FIG. 12(a), the process is the same as for the above-described examples with respect to the materials, the heating profile, control of the distance between opposing electrodes (referred to below as height control), and the like. As a result, the semiconductor device shown in FIG. 12(b) is manufactured. An electrically conductive resin layer 1a is formed between the substrate 10 and the semiconductor chip 20, but the region between the electrode pads 21 and the lands 11 is occupied by the electrically conductive substance 3a, and regions other than those between the electrode pads 21 and the lands 11 are occupied by the cured resin 2a.

In order to supply the electrically conductive adhesive 1b so as to fill the entire space sandwiched between the substrate 10 and the semiconductor chip 20, the substrate 10 and the semiconductor chip 20 may previously be made to oppose each other, and the electrically conductive adhesive 1b may be injected into the entire space formed therebetween. However, in a mounting process which is carried out such that the gap between the substrate 10 and the semiconductor chip 20 becomes small, it is easier to supply the electrically conductive adhesive 1b by carrying out precoating of the substrate 10 as described above than by performing injection, and the entire space between opposing members can be filled with the electrically conductive adhesive 1b with certainty.

A test was carried out to ascertain the result of the mounting process of FIG. 12. As substrates, two glass epoxy substrates (FR4) on which was formed copper stripe wiring having a wire width of 318 micrometers and a spacing between wires of 318 micrometers were used, and a electrically conductive adhesive 1b was applied between them. Copper pads which opposed each other on the glass epoxy substrates were terminals. The electrically conductive adhesive 1b was a resin containing low melting point metal fillers. An alloy having a composition of Sn-48In was used as the electrically conductive particles 3b, and Penguin Cement RD-0205 was used as a resin 2b. The heating profile shown in FIG. 8 was used for heating the electrically conductive adhesive 1b. The height was controlled to be 300 micrometers prior to melting of the electrically conductive particles 3b and was made 100 micrometers after melting of the electrically conductive particles 3b.

Figure 13A:
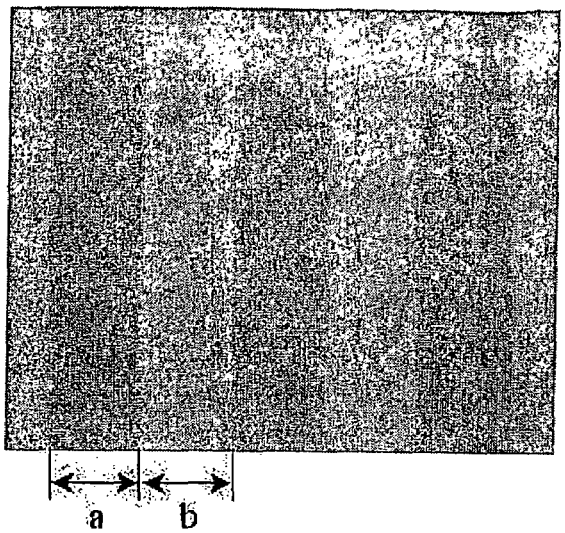
FIGS. 13(a)-(c) are X-ray transmission photographs of samples obtained by the mounting process shown in FIG. 12.
Figure 13B:
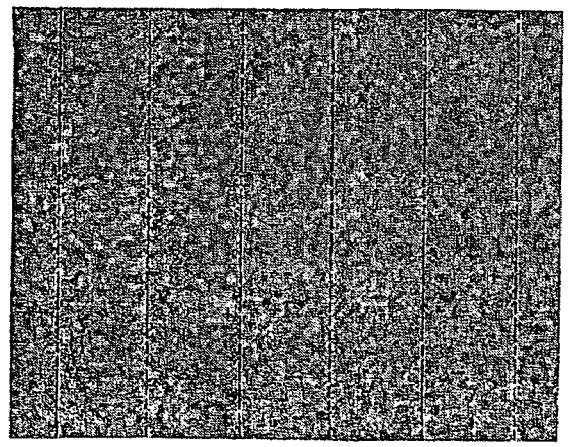
Figure 13C:
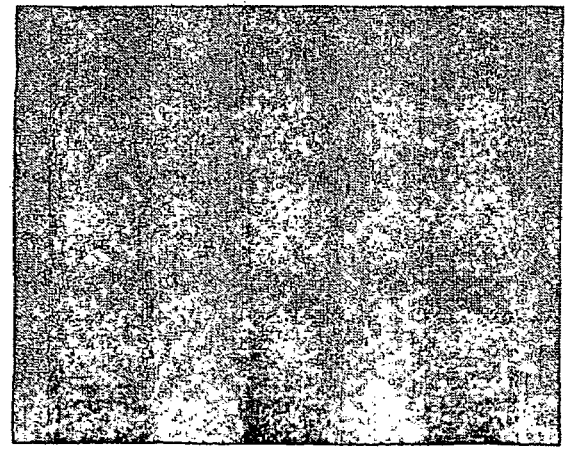
Figure 14A:
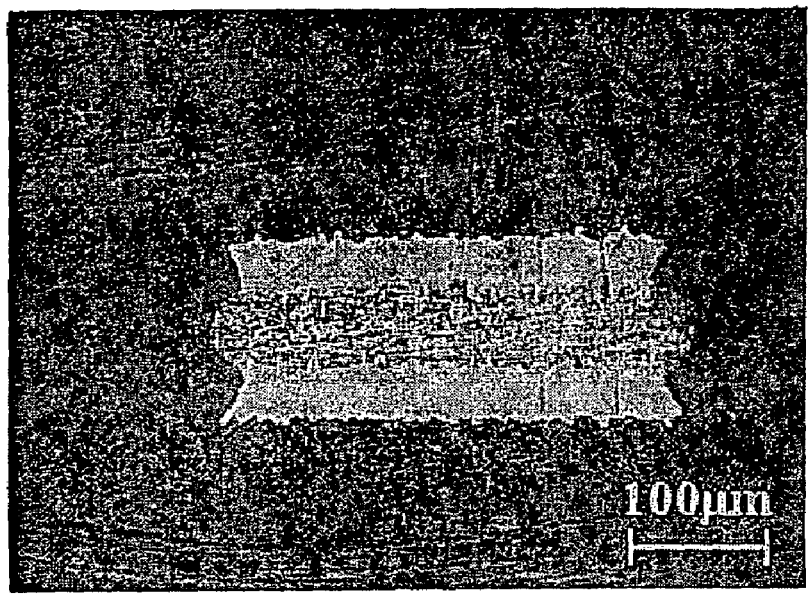
FIG. 14(a) is a photograph of a cross section of a sample after mounting obtained by the mounting process shown in FIG. 12.
Figure 14B:
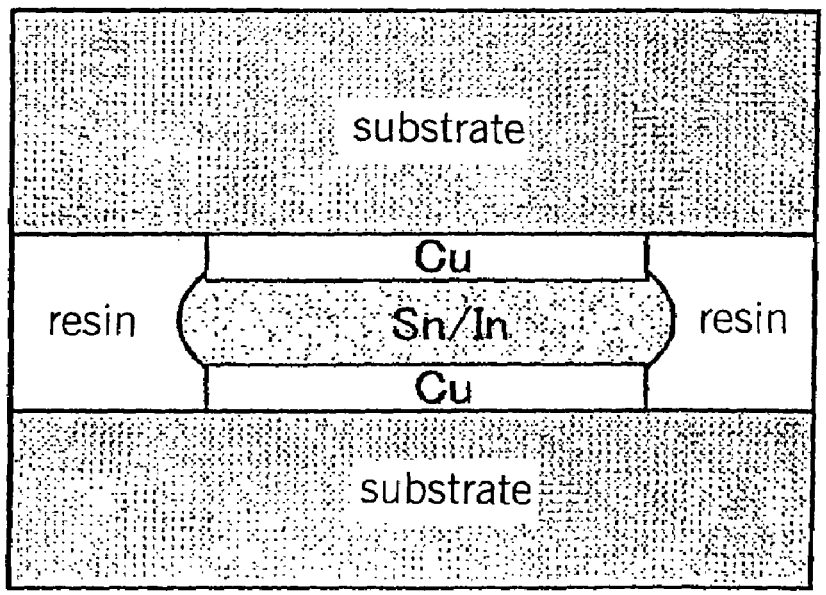
FIG. 14(b) is a cross-sectional view for explaining the photograph of FIG. 14(a).

FIG. 15 is an x-ray transmission photograph of a sample obtained by the mounting process shown in FIG. 12. FIG. 13(a) shows the state of a sample prior to application of the electrically conductive adhesive 1b as viewed in the direction perpendicular to the substrate surface, FIG. 13(b) shows the state of the sample after application of the electrically conductive adhesive 1b as viewed in the direction perpendicular to the substrate surface, and FIG. 13(c) shows the state of the sample after mounting as viewed in the direction perpendicular to the substrate surface. Symbol a in FIG. 13(a) shows the width of the wires, and b shows the wire spacing. FIG. 14(a) is a photograph of a cross section of the sample after mounting. FIG. 14(b) is a drawing of the cross section of FIG. 14(a).

As can be seen from these, by heating and pressing the electrically conductive adhesive 1b (the resin composition containing low melting metal fillers) which fills the entire space sandwiched between the substrates, after curing of the electrically conductive adhesive 1b, metal particles agglomerate in the copper portions, and only resin is present in portions other than the copper portions. In this manner, copper pads are metallically interconnected by a Sn—In alloy, adjoining copper pads are insulated from each other by the resin material, and adhesive bonding which guarantees adequate adhesive strength is achieved.

In the above manner, by the process of the present example, the application of an electrically conductive adhesive 1b is simplified, the number of process steps is greatly reduced, and metallic bonding and resin bonding are simultaneously accomplished. Accordingly, fine working such as bump formation, localized application of electrically conductive paste, and formation of openings in electrode portions become unnecessary. In addition, in spite of the fact that an anisotropic electrically conductive composition is applied to the entire surface of a substrate and conductivity is obtained only in the pad portions, adequate conductivity is obtained, and adequate electrical resistance is obtained between adjoining electrodes which should not conduct with each other. In addition, with the above-described process, low temperature working is possible during mounting.

INDUSTRIAL APPLICABILITY

The present invention can be widely utilized as a mounting method in the field of electronics. In particular, it can be used for connecting the peripheries of liquid crystal display panels in mobile equipment such as mobile phones and PDA's.

The invention claimed is:

1. A method of interconnecting terminals comprising:
   placing terminals so as to oppose each other with an anisotropic electrically conductive resin composition including at least electrically conductive particles and a resin component which is not completely cured at the melting point of the electrically conductive particles disposed between the opposing terminals;
   heating the resin composition to a temperature which is higher than the melting point of the electrically conductive particles and at which the resin component is not completely cured with the opposing terminals separated from each other by a space large enough to enable the particles to move laterally inside the space, wherein in the heating, the electrically conductive particles collect between the opposing terminals by melting and agglomeration of the electrically conductive particles, and the opposing terminals are electrically interconnected; and
   curing the resin component.

2. A method of interconnecting terminals as claimed in claim 1 wherein the resin component comprises a resin having reducing properties which can reduce at least one of the surface of the terminals and the surface of the electrically conductive particles.

3. A method of interconnecting terminals as claimed in claim 1 including completely filling the space between members on which the terminals are provided with the resin composition.

4. A method of interconnecting terminals as claimed in claim 1 including performing the heating with the terminals separated from each other by a distance which is at least a multiple of the diameter of the particles.

5. A method of interconnecting terminals as claimed in claim 1 including metallically bonding a plurality of the particles to the terminals.

6. A method of interconnecting terminals as claimed in claim 1 including arranging the plurality of terminals in a plurality of pairs, each pair comprising a first terminal and a second terminal opposing the first terminal, with the anisotropic electrically conductive resin composition disposed in a plurality of discrete masses each disposed between the first and second terminals of a different one of the pairs of terminals and spaced from the masses of the resin composition disposed between the other pairs of terminals, wherein the curing of the resin component is performed while leaving regions which do not contain the resin component or the electrically conductive particles between different pairs of the terminals.

7. A method of interconnecting terminals as claimed in claim 1 wherein the electrically conductive particles have a melting point of at most 250° C.

8. A method of interconnecting terminals as claimed in claim 1 wherein the electrically conductive particles comprise an Sn alloy.

9. A method of mounting a semiconductor device comprising:
   placing electrode pads of a semiconductor chip opposite circuit electrodes provided on a circuit substrate so as to correspond to the electrode pads with an anisotropic electrically conductive resin composition including at least electrically conductive particles and a resin component which is not completely cured at the melting point of the electrically conductive particles disposed between the opposing electrode pads and circuit electrodes;

heating the resin composition to a temperature which is higher than the melting point of the electrically conductive particles and at which the resin component is not completely cured with the opposing electrode pads and circuit electrodes separated from each other by a space large enough to enable the particles to move laterally inside the space, wherein in the heating, the electrically conductive particles collect between the opposing electrode pads and circuit electrodes by melting and agglomeration of the electrically conductive particles, and the opposing electrode pads and circuit electrodes are electrically interconnected; and curing the resin component.

10. A mounting method as claimed in claim 9 including completely filling the space between the semiconductor chip and the circuit substrate with the resin composition.

11. A mounting method as claimed in claim 10 wherein during the heating, substantially all of the electrically conductive particles in the resin composition collect in regions between opposing electrode pads and circuit electrodes.

12. A mounting method as claimed in claim 9 including performing the heating with the opposing electrode pads and circuit electrodes separated from each other by a distance which is at least a multiple of the diameter of the particles.

13. A method of interconnecting terminals comprising:

placing a first member having a. plurality of first terminals opposite a second member having a plurality of second terminals so that each of the first terminals opposes one of the second terminals to define a plurality of pairs of opposing terminals with an anisotropic electrically conductive resin composition including electrically conductive particles and a resin component which is not completely cured at the melting point of the electrically conductive particles completely filling a region between the first and second members which contains the pairs of opposing terminals;

heating the resin composition to a temperature which is higher than the melting point of the electrically conductive particles and at which the resin component is not completely cured with the two terminals in each pair of opposing terminals separated from each other by a space large enough to enable the particles in the resin composition to move laterally inside the space, wherein in the heating, a plurality of the electrically conductive particles in the composition move from outside the spaces between the opposing terminals into the spaces between the opposing terminals and accumulate in the spaces together with electrically conductive particles already inside the spaces prior to the heating by melting and agglomeration of the electrically conductive particles to electrically interconnect the two opposing terminals in each of the pairs of opposing terminals; and curing the resin component.

14. A method of interconnecting terminals as claimed in claim 13 including metallically bonding a plurality of the electrically conductive particles to the terminals.

* * * * *